United States Patent [19]

Wakamatsu

[11] Patent Number: 5,048,166
[45] Date of Patent: Sep. 17, 1991

[54] METHOD OF MAKING RIGID-FLEXIBLE MULTILAYER BOARD SYSTEM

[75] Inventor: Chiharu Wakamatsu, Kanagawa, Japan

[73] Assignee: Mitsubishi Denki K.K., Tokyo, Japan

[21] Appl. No.: 505,573

[22] Filed: Apr. 6, 1990

Related U.S. Application Data

[62] Division of Ser. No. 234,080, Aug. 19, 1988.

[30] Foreign Application Priority Data

Aug. 28, 1987 [JP] Japan .................................. 62-214508

[51] Int. Cl.⁵ .................................................. H05K 3/36
[52] U.S. Cl. ...................................... 29/830; 29/840; 228/180.1; 228/180.2; 439/44; 439/47; 439/48; 439/67
[58] Field of Search ....................... 174/250, 254, 261; 361/397, 398, 412, 414, 406; 439/44, 47, 48, 50, 65, 67, 69, 74, 82, 85; 29/840; 228/180.1, 180.2, 830

[56] References Cited

U.S. PATENT DOCUMENTS

| | | | |
|---|---|---|---|
| 4,139,881 | 2/1979 | Shimizu et al. | 361/406 X |
| 4,506,443 | 3/1985 | Itoh | 29/840 |
| 4,515,304 | 5/1985 | Berger | 228/180.1 X |
| 4,761,881 | 8/1988 | Bora et al. | 29/840 |

FOREIGN PATENT DOCUMENTS 59-207689  5/1983  Japan .

*Primary Examiner*—Carl J. Arbes
*Attorney, Agent, or Firm*—Kanesaka & Takeuchi

[57] ABSTRACT

Mounting only electronic parts on a printed circuit board puts a limit on the mounting density. According to the invention, electronic parts are mounted on a flexible board. This flexible board is then mounted on a printed circuit board to thereby increase the mounting density.

1 Claim, 10 Drawing Sheets

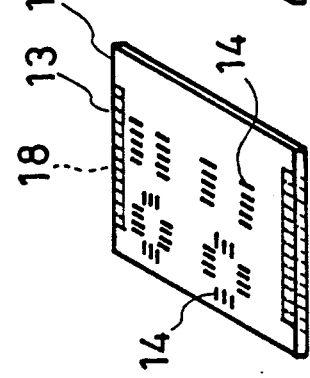
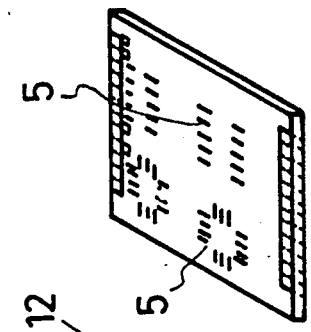
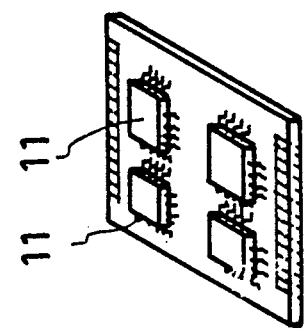
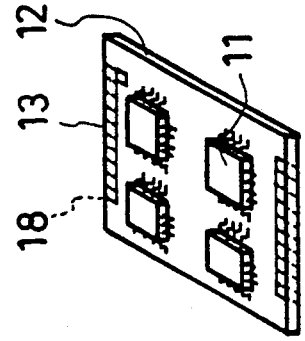
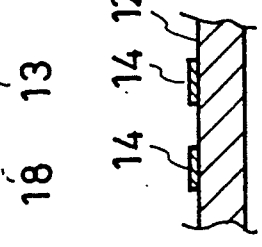
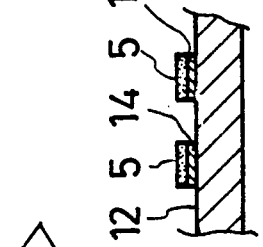
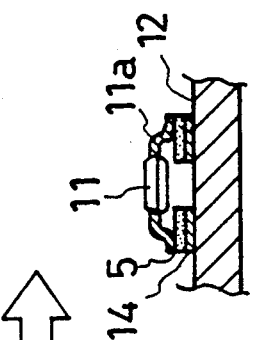
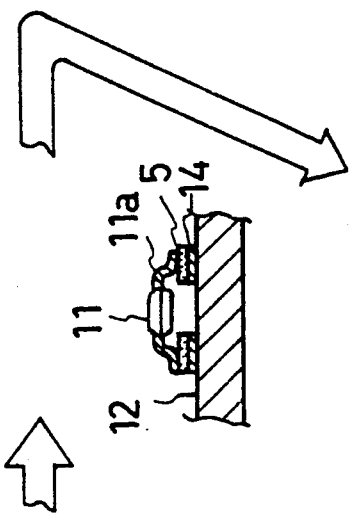

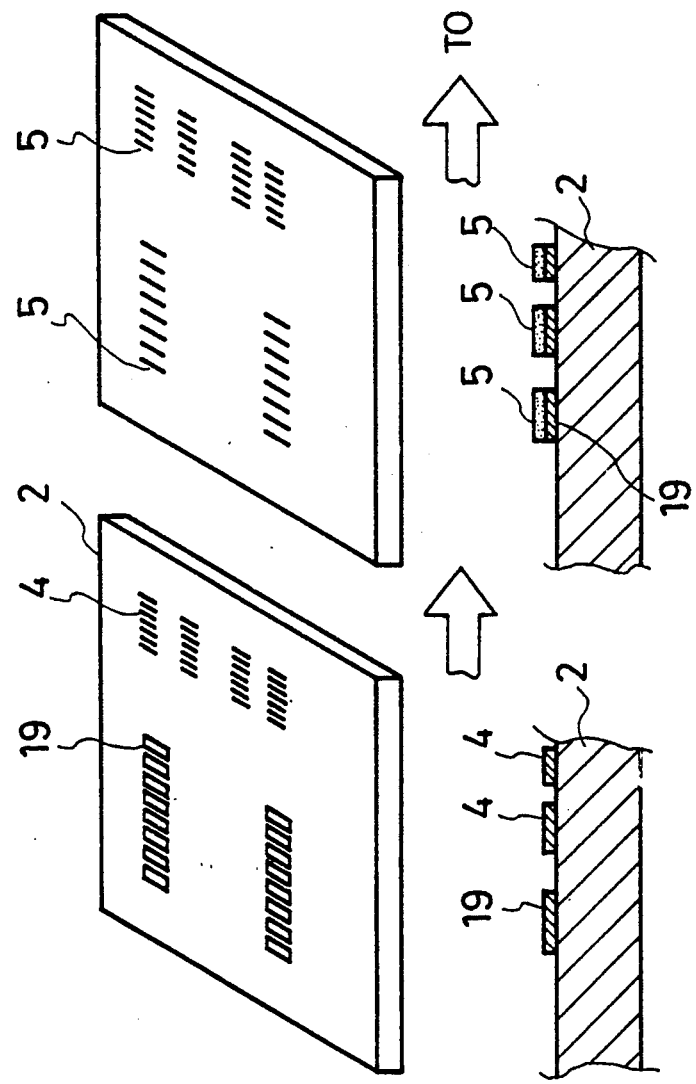

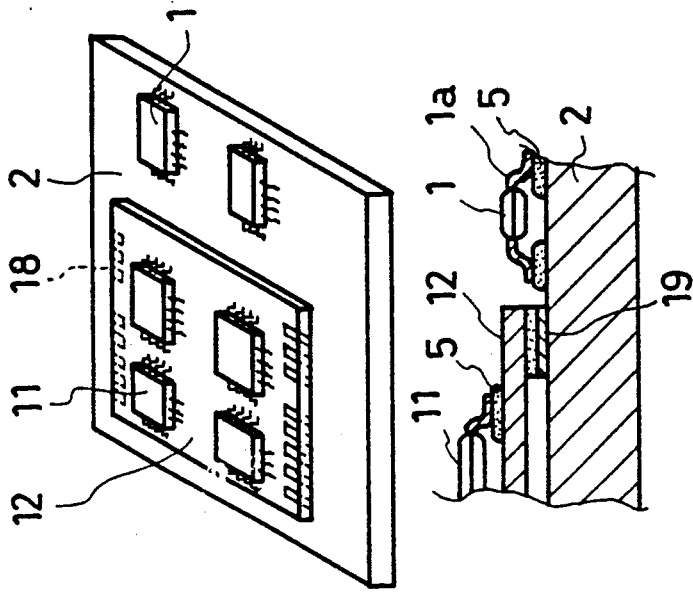
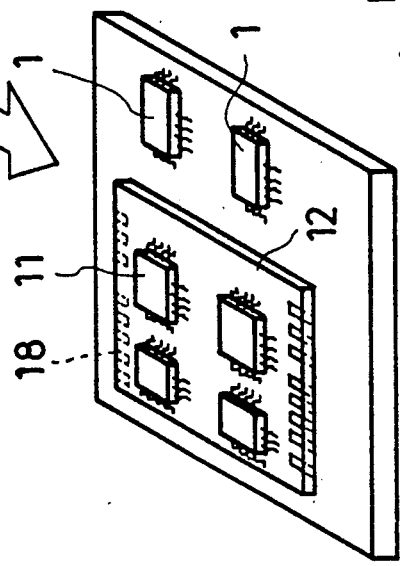
FIG.3(D)
FIG.3(C)

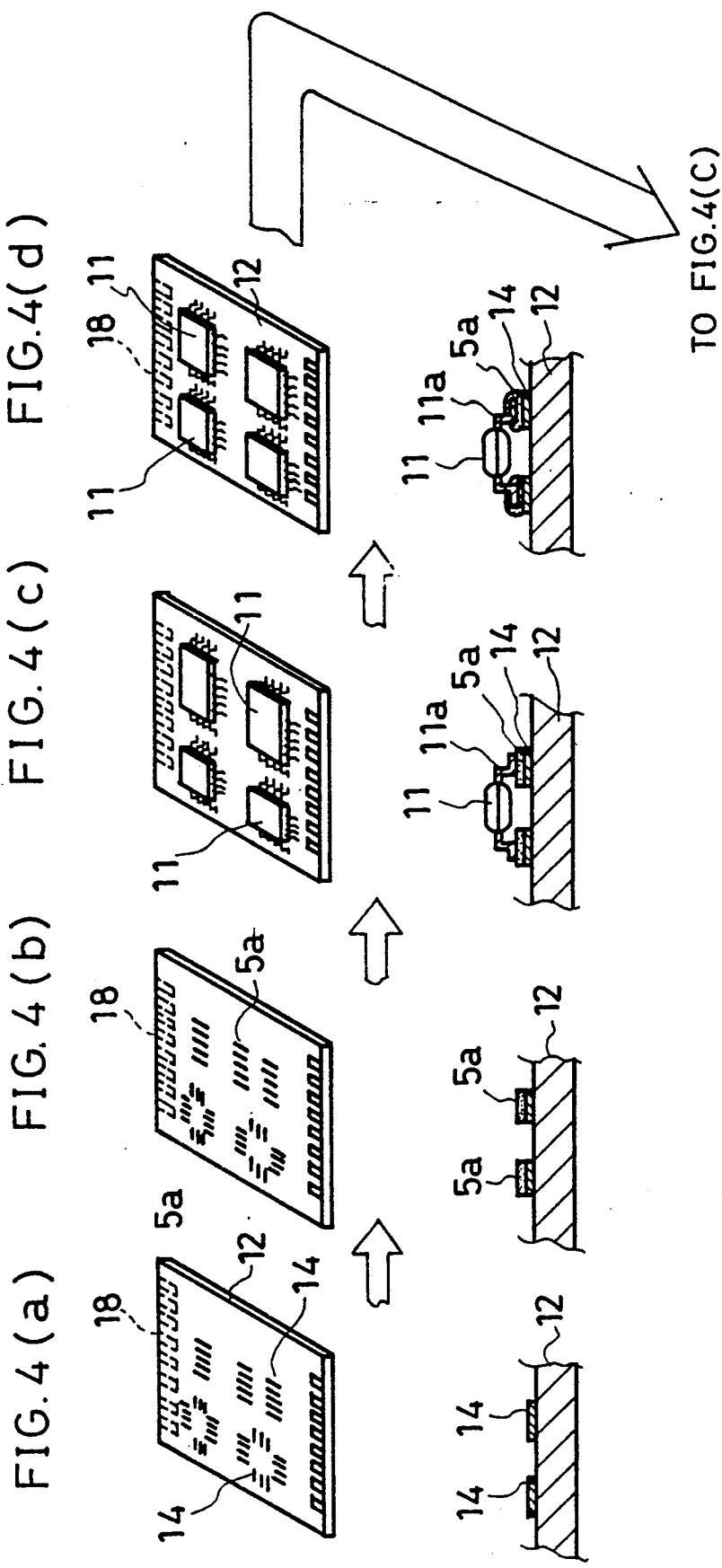

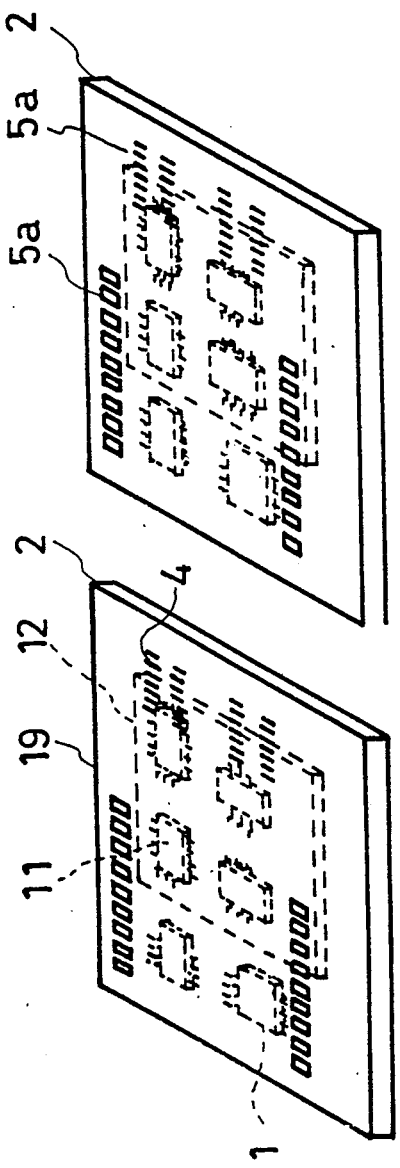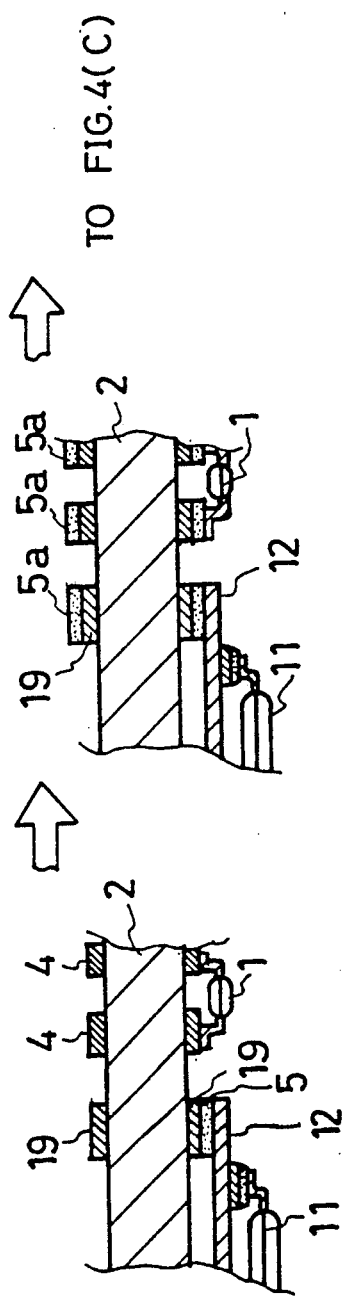

1

METHOD OF MAKING RIGID-FLEXIBLE MULTILAYER BOARD SYSTEM

CROSS-REFERENCE TO RELATED APPLICATION

This is a division of application Ser. No. 234,080 filed Aug. 19, 1988.

BACKGROUND OF THE INVENTION

The present invention relates to methods of mounting electronic parts or components on a printed circuit board.

A conventional electronic part mounting system is shown in FIGS. 5 and 6. Electronic parts or components 1 each have a number of lead pins 1a each extending from a side first laterally and then downwardly for connection with a signal or power supply. These electronic parts 1 are mounted on a multilayer printed circuit board 2 which has a terminal 3 for connection with the outside.

As best shown in FIG. 6, each electronic part 1 is mounted on mounting lands 4 with solder 5 for connection with wiring patterns 6 which are formed on the surfaces or layers of the printed circuit board 2. A cylindrical conductou 7a is inserted in an aperture 7 which is formed through the respective layers of the board 2.

To mount electronic parts on a printed circuit board, first of all, creamy solder 5 is applied to the mounting lands 4 by the screen printing technique. Then, electronic parts 1 are attached to the soldered lands 4 with adhesive by an automatic mounting machine. The solder 5 is then melted to secure the lead pins 1a of the electronic part 1 to the mounting lands 4.

As the number of electronic parts 1 mounted on the surfaces of a printed circuit board 2 increases, the number of wiring patterns 6 increases, thus limiting the mounting space for the electronic parts. This problem is solved to a certain extent by increasing the number of layers of the printed circuit board 2. However, this technique increases the thickness of the board 2 and the unit manufacturing cost.

SUMMARY OF THE INVENTION

Accordingly, it is an object of the invention to provide an electronic part mounting system which permits high density mounting of electronic parts.

Another object of the invention is to provide an electronic part mounting system at low costs.

According to the invention there is provided an electronic part mounting system, which includes a printed circuit board and a multilayer flexible board mounted on the printed circuit board, with a part of wiring patterns on the printed circuit board formed on the multilayer flexible board.

These objects together with others not specifically mentioned will become clear to those skilled in the art from the following description taken in conjunction with the accompanying drawings.

BRIEF DESCRIPTION OF THE DRAWINGS

FIGS. 3(a) through 3(d) and 3(A) through 3(D) and 4(a) through 4(d) and 4(A) through 4(D) illustrate a mounting process;

DESCRIPTION OF THE PREFERRED EMBODIMENT

Figure 1:
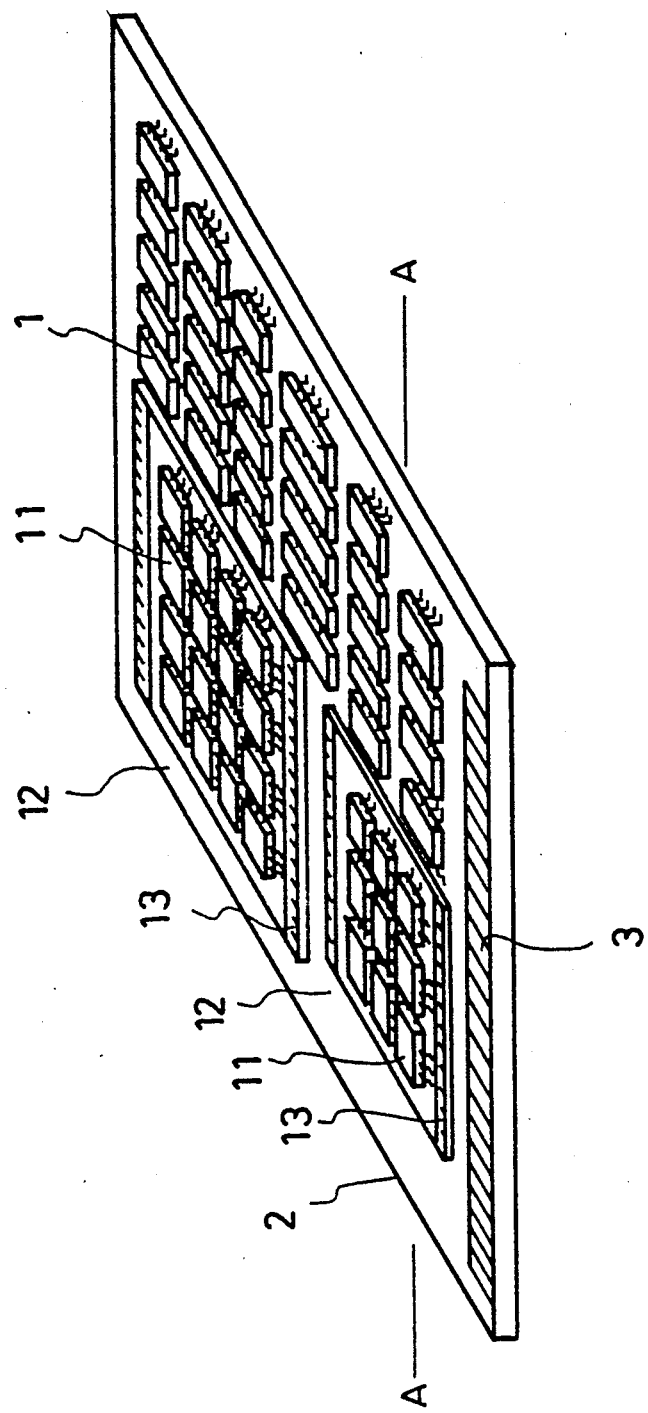
FIG. 1 is a perspective view of an electronic part mounting system according to an embodiment of the invention.
Figure 2:
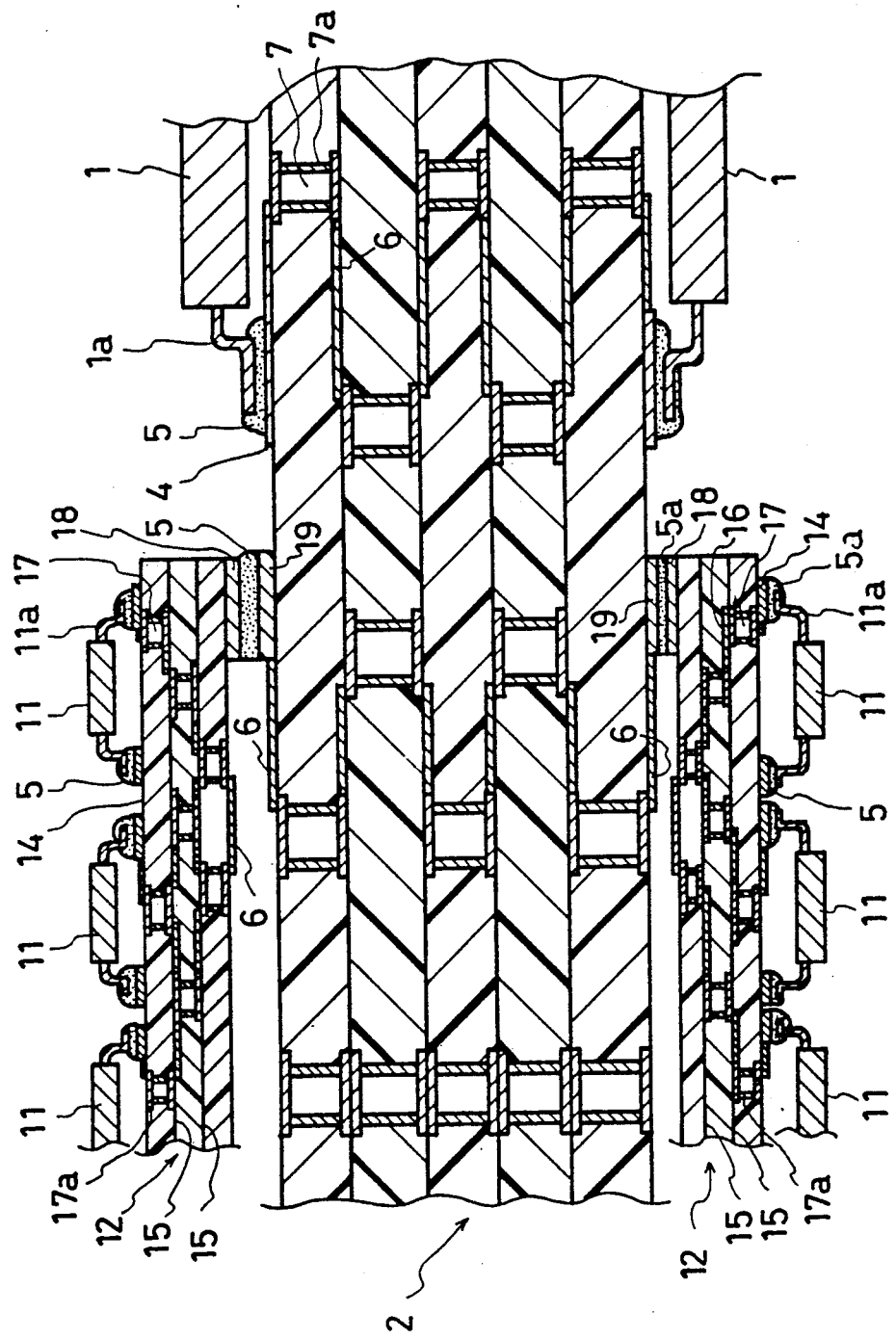
FIG. 2 is an enlarged sectional view taken along the line A—A of FIG. 1.
Figures 4C, 4D:
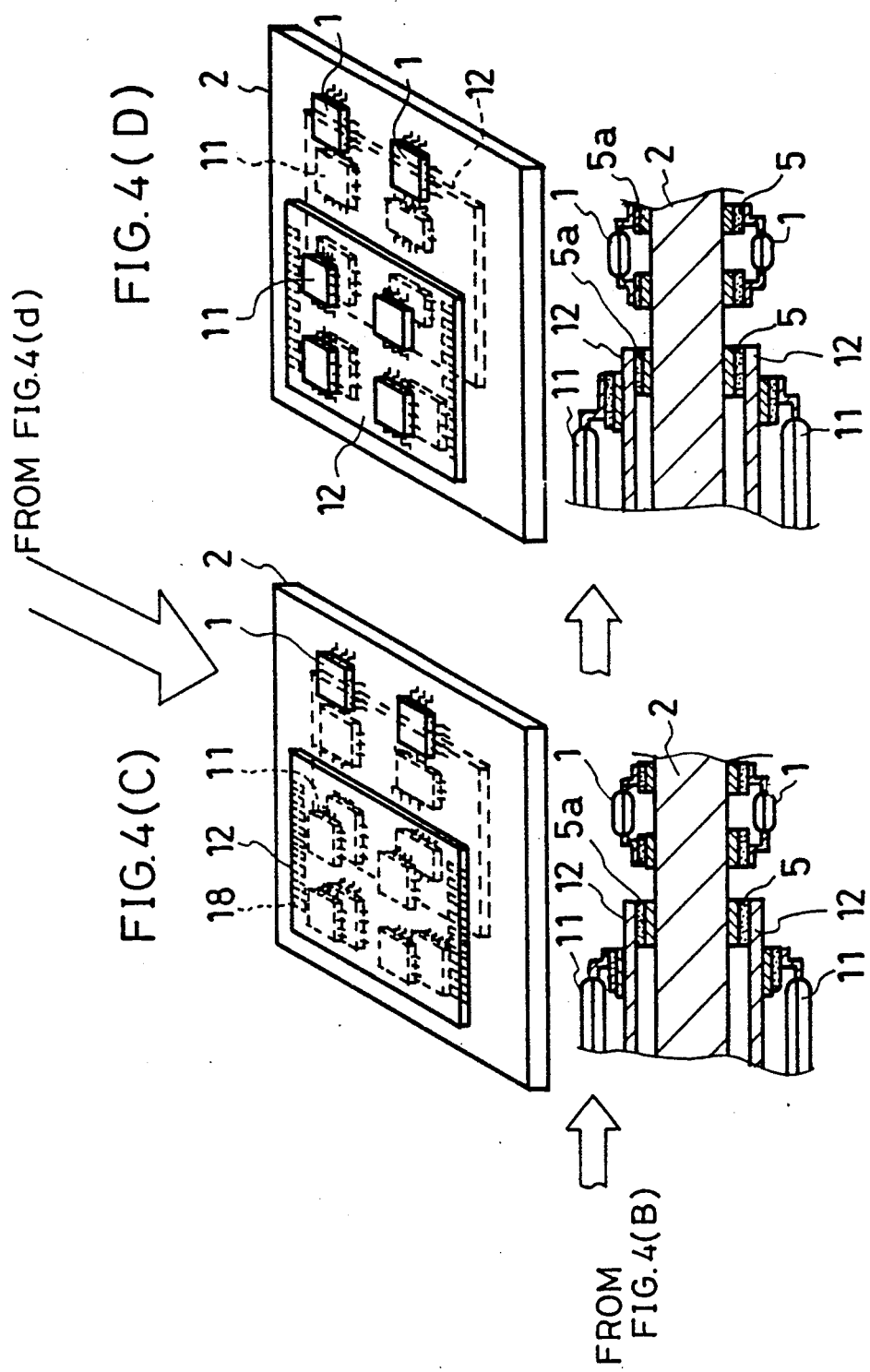
Figure 5:
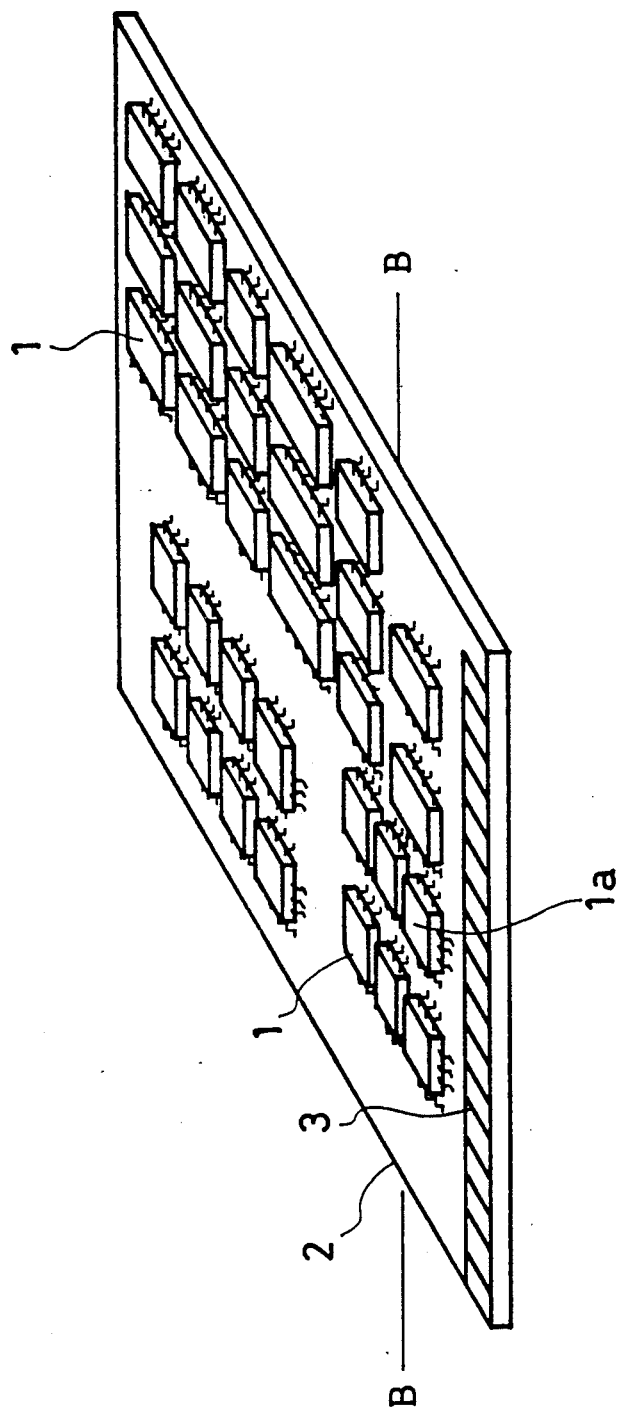
FIG. 5 is a perspective view of a conventional electronic part mounting system.
Figure 6:
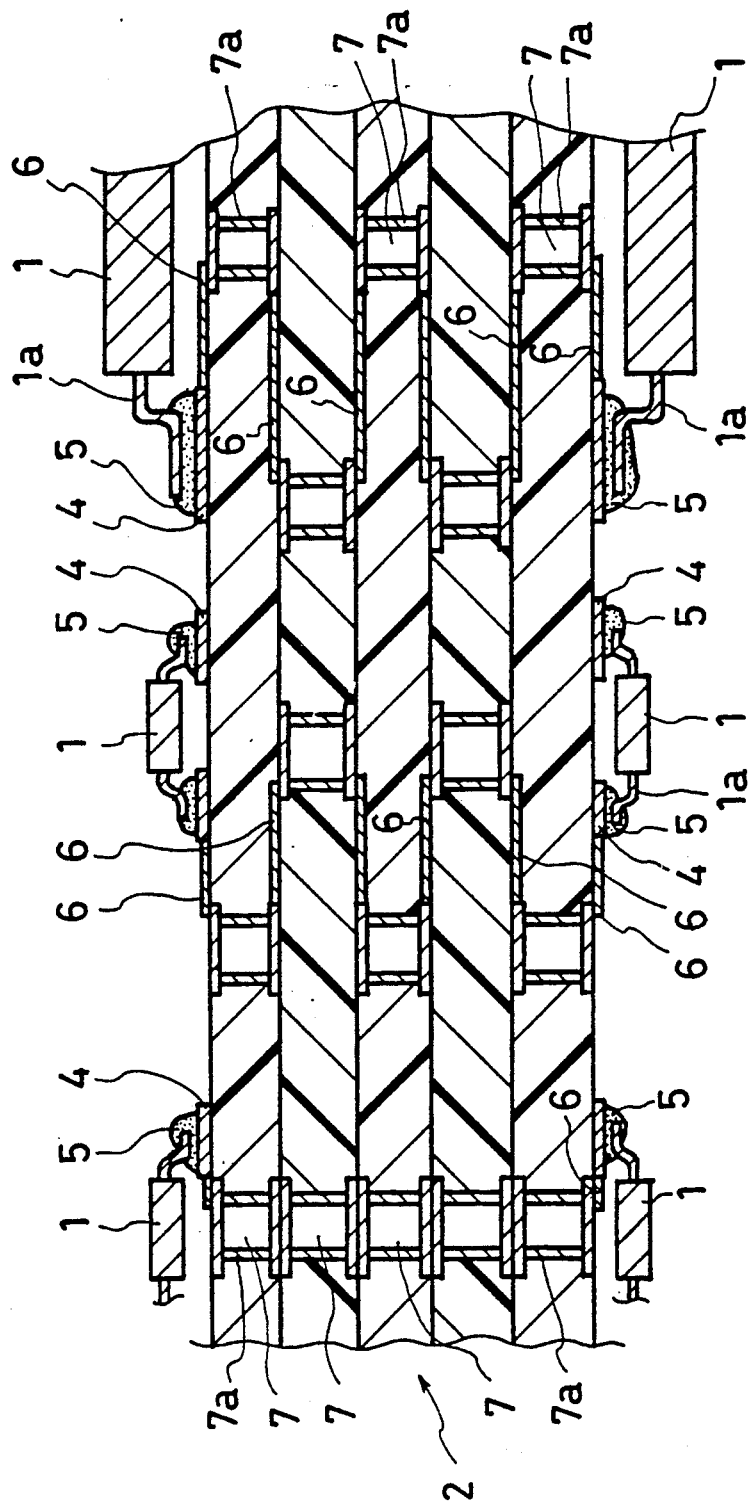
FIG. 6 is an enlarged sectional view taken along the line B—B of FIG. 5.

An electronic part mounting system according to an embodiment of the invention will now be described with reference to FIGS. 1 through 4, wherein all parts identical with those of FIGS. 5 and 6 are assigned the same reference numerals, and their detail description will be omitted.

Electronic parts or components 11 with lead pins 11a are mounted on a multilayer flexible board 12. The multilayer flexible board 12 has a terminal 13 for connection with the outside, mounting lands 14, and wiring patterns 16 which are part of wiring patterns 6 to be formed on the surfaces of a printed circuit board 2. These wiring patterns 16 are provided on the surfaces and layers 15 of the multilayer flexible-board 12. A cylindrical conductor 17a is inserted into an aperture 17 formed through the layers of the multilayer flexible board 12. A board mounting land 18 is secured with solder 5 or 5a to a board mounting land 19 provided on the surfaces of the printed circuit board 2.

A mounting method according to an embodiment of the invention will now be described with reference to FIGS. 3 and 4. As shown in FIG. 3(a), part mounting lands 14 are provided on a multilayer flexible board 12. In FIG. 3(b), creamy solder 5 is applied to the part mounting lands 14 by the screen printing technique. In FIG. 3(c), the lead pins 11a of an electronic part 11 is attached to the part mounting lands 14 with adhesive by an automatic mounting machine. The multilayer flexible board 12 with electronic parts 11 is then placed in a furnace (not shown) which has been heated to temperatures above the melting point of the solder 5, thus securing the electronic parts 11 to the mounting lands 14 as shown in fig. 3(d).

On the other hand, as shown in FIG. 3(A), a printed circuit board 2 has part mounting lands 4 and board mounting lands 19. In FIG. 3(B), creamy solder 5 is applied to these lands 4 and 19 by the screen printing technique. In FIG. 3(C), the lead pins 1a of electronic parts 1 and the board mounting lands 18 of the multilayer flexible board 12 are attached to these lands 4 and 19, respectively, with adhesive by an automatic mounting machine. The printed circuit board 2 is then placed in a furnace (not shown) which has been heated to temperatures above the melting point of the solder 5, thus securing the electronic parts 1 and the multilayer flexible board 12 to the part mounting lands 4 and the board mounting lands 19, respectively, as shown in FIG. 3(D).

In FIG. 4(A), the above printed circuit board 2 is turned upside down. In FIG. 4(B), creamy solder 5a having a lower melting point than that of the above solder 5 is applied to part mounting lands 4 and board mounting lands 19 on the back of the board 2 by the screen printing technique. In FIG. 4(C), electronic parts 11 and a multilayer flexible board 12 made by a method such as shown in FIGS. 4(a) through 4(d) (with solder 5a having a lower melting point than that of the solder 5 are attached to the solder 5a with adhesive by an automatic mounting machine. The printed circuit board 2 is then placed in a furnace (not shown) heated to temperatures between the melting point of the solder 5a and the melting point of the solder 5 to melt the solder 5a, thereby securing the multilayer flexible board 12 and the electronic parts 1 to the back of the printed circuit board.

With the above structure, part of the wiring patterns to be formed on the surfaces or layers of the multilayered printed circuit board 2 may be formed on the surfaces or wiring layers 15 of the multilayer flexible board 12 so that more electronic parts are able to mount without any increase in the number of layers of the printed circuit board 2. Thus, it is possible to provide a thin printed circuit board having a high mounting density.

Alternatively, electronic parts 11 may, of course, be mounted on on both surfaces of the multilayer flexible board 12. The multilayer flexible board 12 may, of course, be mounted on only one surface of the printed circuit board 2.

With the electronic part mounting system according to the invention, it is possible to increase the mounting density of electronic parts and reduce the thickness of a printed circuit board and the unit manufacturing cost.

What is claimed is:

1. A method of making a rigid-flexible multilayer board system, which comprises the steps of:

applying a first solder having a first melting point to at least two part mounting lands of a flexible multilayer printed circuit board;

attaching at least two lead pins of a first electronic part to said part mounting lands;

subjecting said flexible multilayer printed circuit board with said electronic part to a first temperature which is higher than said first melting point whereby said electronic part is secured to said flexible multilayer printed circuit board;

applying a second solder having a second melting point to at least two part mounting lands and two board mounting lands of a rigid multilayer printed circuit board;

attaching at least two lead pins of a second electronic part to said part mounting lands of said rigid printed circuit board and two board mounting lands of said flexible multilayer printed circuit board to said board mounting lands of said rigid multilayer printed circuit board; and subjecting said rigid multilayer printed circuit board with said flexible multilayer printed circuit board and said first and second electronic parts to a second temperature which is lower than said first melting point but higher than said second melting point, whereby said flexible multilayer printed circuit board and said second electronic part are secured to said rigid multilayer printed circuit board.

* * * * *